United States Patent [19]

Matsushita et al.

[11] Patent Number: 4,944,270

[45] Date of Patent: Jul. 31, 1990

[54] ASYMMETRICAL EXCITATION TYPE MAGNETIC DEVICE AND METHOD OF MANUFACTURE THEREOF

[76] Inventors: Akira Matsushita, 12-5, Miyazaki 1-Chome, Miyamae-Ku, Kawasaki-Shi, Kanagawa-Ken; Susumu Abe, 9-204, Nishi-Kandaiji Danchi, 3-5 Kandaiji, Kanagawa-Ku, Yokohama-Shi, Kanagawa-Ken, both of Japan

[21] Appl. No.: 158,787

[22] Filed: Mar. 31, 1988

[30] Foreign Application Priority Data

Mar. 31, 1987 [JP] Japan ............................... 62-75978
Aug. 17, 1987 [JP] Japan ............................... 62-203840
Sep. 21, 1987 [JP] Japan ............................... 62-236744
Sep. 21, 1987 [JP] Japan ............................... 62-236745
Sep. 21, 1987 [JP] Japan ............................... 62-236746

[51] Int. Cl.⁵ .................... F02P 7/067; H01F 1/00; H03K 3/45; G11C 11/02
[52] U.S. Cl. .................... 123/414; 29/602.1; 29/604; 29/608; 29/609; 123/617; 310/70 R; 310/152; 365/133
[58] Field of Search ............... 123/414, 617, 643; 310/70 R, 70 A, 152, 156; 307/419; 324/208; 365/133; 29/602 R, 603–609

[56] References Cited

U.S. PATENT DOCUMENTS

| | | | |
|---|---|---|---|
| 4,263,523 | 4/1981 | Wiegand | 307/419 |
| 4,374,403 | 2/1983 | Oshima et al. | 360/110 X |
| 4,484,090 | 11/1984 | Wiegand et al. | 307/419 |
| 4,635,227 | 1/1987 | Norman | 365/133 |
| 4,639,670 | 1/1987 | Normann | 310/152 X |

FOREIGN PATENT DOCUMENTS 2826609 1/1980 Fed. Rep. of Germany ...... 123/617

*Primary Examiner*—Tony M. Argenbright
*Attorney, Agent, or Firm*—Fleit, Jacobosn, Cohn, Price, Holman & Stern

[57] ABSTRACT

An asymmetric excitation type magnetic device is provided with a composite magnetic body composed of a first magnetic layer having a relatively strong coercive force and a second magnetic layer having a relatively weak coercive force which layers are combined so as to have their respective magnetic anisotropy oriented in the same direction. To such a composite magnetic body are applied external positive and negative asymmetric magnetic fields in a specified order thereby to produce variations in magnetic flux due to an escpecially quick magnetization reversal and resultantly to generate steep pulse outputs across a detecting coil.

26 Claims, 8 Drawing Sheets

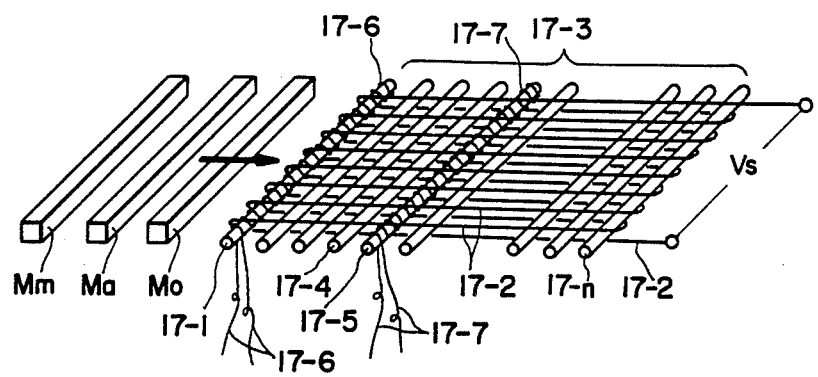
FIG. 17
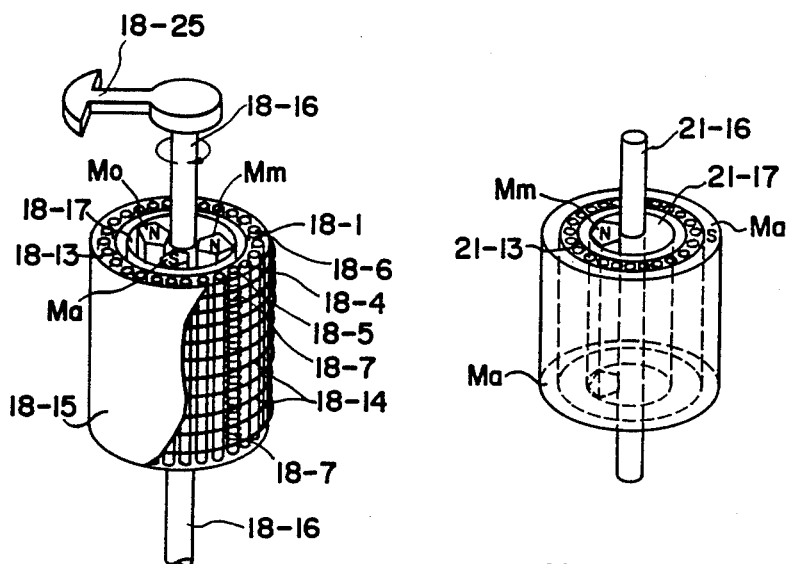
FIG. 18
FIG. 21

ASYMMETRICAL EXCITATION TYPE MAGNETIC DEVICE AND METHOD OF MANUFACTURE THEREOF

BACKGROUND OF THE INVENTION

The present invention relates to an asymmetrically exciting type magnetic device made of composite magnetic materials capable of generating a steep pulse electromotive force in response to the action of an exterior magnetic field.

The exterior magnetic field can be produced by a permanent electromagnet or the magnetic field induced when an electric current flows.

Such electromagnetic type pulse generators are adapted to be used to produce the pulse signals for the position of a moving body and can be applied to electric and electronic apparatuses and automatic control systems all of which need a large number of successive pulse signals.

In addition, they can be used as an operation timing control device with a high accuracy for generating pulse signals for controlling various computers in an automotive vehicle and ensuring an optimum ignition operation of a gasoline engine and an optimum heating or cooling operation in response to the variations in gas pressure in a stirling engine.

The present invention can be also used as an ampere meter and a current sensor for detecting an overcurrent in an electric distribution system.

The electric current sensor can be used to detect not only the current including a direct current which ranges from a super low frequency range to a high frequency range but also to measure an overcurrent such as an impulse.

The present invention further provides measuring instruments which can be used in voltage meters and ampere meters.

Furthermore, the magnetic device in accordance with the present invention can be widely used as a special magnetic storage device for writing and reading information under the action of an exterior magnetic field.

Various methods for producing pulses by utilizing electromagnetic induction have been used and demonstrated.

In general, the magnitude of the electromotive force produced by the electromagnetic induction is dependent upon the variations in time of the magnetic flux intersecting a detection coil mounted on a ferromagnetic material so that when the variation ratio becomes extremely low, no electromotive force is produced.

However, extensive studies and experiments have been conducted to find magnetic materials, which are not dependent upon the ratio of variations in time of the intersecting magnetic flux. For instance, according to a Bistable Magnetic Device disclosed in U.S. Pat. No. 3,820,090 by J. R. Wiegand, a Self-Nucleating Magnetic Wire is produced by subjecting permalloy to a tension and twisting process so that the coercive force at the shell portion is stronger than that at the core portion. It has a phenomenon that when one exterior magnetic field disappears, a pulse is generated and that when the magnetic field disappears, the direction of magnetization of the core portion of the wire establishes a return magnetic path of the shell by self reversal. Therefore the underlying principle of the above-mentioned wire is that in response to the variations of the magnetic flux, a pulse is generated across a detection coil.

The above-described reversal phenomenon inevitably occurs when the external magnetic field disappears because in the case of a short magnetic body, the action of the opposite magnetic field at each pole is generally dominant. However, the output pulse thus produced is relatively low and there is a defect that it is very difficult to correctly control a time point at which a pulse is generated.

So far, as means for indirectly measuring the value of a current flowing through a line, there has been used a method in which the magnetic field produced when the current flows through the line is trapped by an instrumental transformer utilizing iron cores, but this method has also the problem that the magnetic circuit and the winding cannot be made compact in size and light in weight.

Furthermore, there has been proposed and used a method in which an electric current is measured by a semiconductor element utilizing the Hall effect and a magnetic circuit, but this method also has the problem that the temperature characteristic and stable operation cannot be ensured so that this method is not reliable in operation.

The utilization of composite magnets especially as a current sensor has been proposed and demonstrated, but this method has the problems that the detection capability is remarkably varied depending upon the magnetization history, i.e. how the composite magnetic body used was previously magnetized. This is an inevitable phenomenon depending upon the magnetic hysteresis so that when used as an electric current sensor, it must be provided with some suitable correction means.

On the other hand, according to the present invention, an asymmetric excitation type composite magnetic body is used so that various objects of the present invention can be attained by a simple means.

An ignition device in accordance with the present invention can be used not only in a conventional contact type ignition system but also a non-contact ignition system which has been developed recently.

At present, there are known electromagnetic type pickups for generating pulse signals equal to the number of the gear shaped magnetic poles per rotation of the rotating shaft of a distributor.

In this case, when the diameter of the gear-shaped magnetic pole is, for instance, of the order of 30 mm, the upper limit of the angle of rotation for generating one pulse is of the order of from 10° to 15° so that there has been a strong demand for a pulse generator capable of generating pulses at a high degree of resolution of the order of 1° or less.

Furthermore, the conventional ignition systems need at least two kinds of signals each representative of the angle of rotation of the crankshaft.

More particularly, one kind of pulse is needed to control the angle of rotation of the above-mentioned distributor while the other kind of pulse is needed to detect which cylinder is operated or ignited.

In order to generate such two kinds of pulse signals, two signal generators are mounted and must be spaced apart from each other by a suitable distance to prevent mutual electromagnetic induction interference. It follows therefore that the whole volume of the two signal generators inevitably becomes large so that there has been also a demand for signal generators compact in size and light in weight or just one generator capable of accomplishing the functions of two signal generators.

Furthermore, in the case of the storage devices utilizing the conventional magnetic bodies, in order to increase the output voltage derived on the read-out operation, means for increasing the ratio of variations of the intersecting magnetic flux have been provided. As a result, there exist the problems that the electric current for generating the magnetic field must be shaped in the form of a rectangular waveform and that the magnetic body must be rotated at a high speed.

SUMMARY OF THE INVENTION

In view of the above, a first object of the present invention is to provide a method·for the production of a composite magnetic body which is subjected to a special treatment and which operates in an asymmetrical excitation mode, and a magnetic device utilizing the specific characteristics of such composite magnetic body.

More particularly the present invention is to provide a method for twisting a special ferromagnetic wire as a method for the production of composite magnetic bodies having special characteristics due to asymmetrical excitation.

A second object of the present invention is to provide an asymmetrically exciting type magnetic device in which a horizontal magnetic layer and a vertical magnetic layer are composed of a composite magnetic body composed of different kinds of ferromagnetic molecules without subjecting a ferromagnetic body to mechanical methods such as tension, twisting and other methods, whereby high-quality pulse electromotive forces are produced by an asymmetric exciting magnetic method.

A third object of the present invention is to provide a novel sensor means capable of quickly and simply measuring the magnitude of an electric current ranging from an extremely small current to a strong current or an overcurrent.

A fourth object of the present invention is to provide a magnetic device in which a plurality of composite magnetic bodies are arranged and an asymmetrical special magnetic field is sequentially applied to them so that, for instance, even when a magnet is displaced at an extremely small velocity, pulses are successively generated.

A fifth object of the present invention is to provide an electromagnetic type pulse generator adapted to detect a position and an angle of rotation of various mechanical devices by applying the capability of detecting the position of the composite magnetic body from among a large number of composite magnetic bodies which contributes to the generation of a pulse.

A sixth object of the present invention is to provide an ignition timing control device in which a rotating pulse generator capable of generating simultaneously a signal for sensing the angle of rotation of a crankshaft and a signal for sensing a cylinder in the ignition system of a gasoline engine with a high degree of accuracy, whereby an optimum control can be attained by cooperating said pulses with a control signal for a computer mounted on an automotive vehicle.

A seventh object of the present invention is to provide high-performance stationary type and movable type storage devices which operate independently of the variation rates of the intersecting magnetic flux on reading-out information from a magnetic storage device.

The above and other objects, effects and features of the present invention will become more apparent from the following description of preferred embodiments thereof taken in conjunction with the accompanying drawings.

BRIEF DESCRIPTION OF THE DRAWINGS

FIGS. 17, 18 and 21 are schematic views illustrating an embodiment of an electromagnetic type pulse generator in accordance with the present invention;

DETAILED DESCRIPTION OF THE PREFERRED EMBODIMENTS

Figure 1:
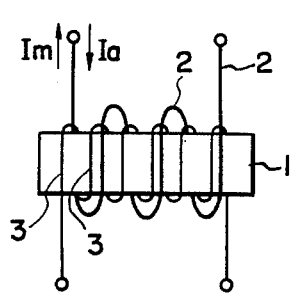
FIGS. 1 and 3 are schematic views illustrating an embodiment of a pulse generator utilizing an asymmetric excitation type magnetic device in accordance with the present invention.

FIG. 1 shows a system in which the exterior magnetic field is controlled by the electric current excitation. An asymmetric excitation type magnetic device 1 has an exciting coil 2 through which flows an electric current at a predetermined magnitude for producing an oriented magnetic field, an auxiliary magnetic field and a main magnetic field, and a detection coil 3 for inducing pulses.

For the sake of better understanding of the underlying principle of the present invention, the magnetic characteristics of the asymmetric excitation type magnetic device 1 in accordance with the present invention will be described with reference to FIG. 2.

Figure 2:
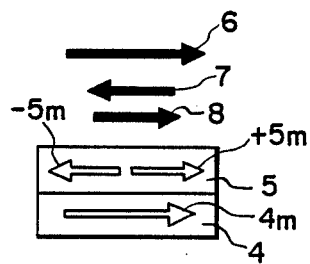
FIG. 2 is a view used to explain the underlying principle of an asymmetrical excitation type magnetic device.

FIG. 2 shows a model of a composite magnetic layer consisting of a lamination of two kinds of ferromagnetic molecules which have different coercive forces and are anisotropic in a surface of FIG. 2 and laminated in such a way that anisotropy becomes coaxial.

More particularly, an asymmetric excitation type magnetic device 1 has a lamination consisting of a first magnetic layer 4 having a relatively strong coercive force and a second magnetic layer 5 having a relatively weak coercive force which are deposited in such a way that both of the anisotropies of the first and second magnetic layer are coaxial with respect to each other as indicated by white arrows and the device 1 has the following described magnetic characteristics when the exterior magnetic field is caused to operate by the asymmetrical excitation method.

Previously a strong orientation magnetic field indicated by a black arrow 6 is exerted so that the whole asymmetric excitation type device 1 is first magnetized in the positive direction (in the right direction in FIG. 2) and then the magnetic field is removed.

Next a relatively weak auxiliary magnetic field 7 is applied so that a portion of the second magnetic layer 5 which has a weak coercive force; that is, only the portion indicated by a white arrow +5 m is displaced in the negative direction (in the left direction in FIG. 2) as indicated by a white arrow −5 m.

In this case, the portion −5 m displaced in the negative direction has uniaxial magnetic anisotropy so that it can be maintained in this state even after the auxiliary magnetic field 7 is removed.

Next when it is desired to displace the portion having a relatively weak coercive force in the positive direction as indicated by the arrow +5 m by applying again the main magnetic field 8, the reversal displacement velocity is extremely high because the displacement is made in the same direction as the direction of the first magnetic layer 4 which is magnetized and has a high coercive force.

It follows therefore that when the detection coil 3 is wound around the asymmetric excitation type magnetic device 1, a steep pulse electromotive force can be induced due to the variation of the magnetic flux caused by the sudden displacement.

In this case, the main magnetic field 8 may have also the function of the orientation magnetic field 6 so that the underlying principle of the present invention remains unchanged even when the device 1 is actuated by the weak auxiliary magnetic field 7 and the strong main magnetic field 8.

So far the composite magnetic layer has been described as having anisotropy in the surface of FIG. 2, but even when the asymmetric excitation magnetic device in accordance with the present invention consists of the composite magnetic layer of the so-called vertically magnetized film obtained by treating the anisotropic direction of different kinds of ferromagnetic molecules which have different coercive forces so as to be perpendicular to the surface of FIG. 2, the same function and effects can be attained. In this case, it is apparent that the magnetic fields are applied in the vertical direction.

When the magnetic layers having anisotropy in the surface of FIG. 2 sandwich the composite magnetic layer from both surfaces thereof, the latter is very effective as it functions as an auxiliary magnet.

So far, in order to apply the external magnetic flux, it has been described that the electric current is made to flow through the exciting coil, but even when a permanent magnet is used instead of the external magnetic field, the mode of operation remains unchanged.

Figure 3:
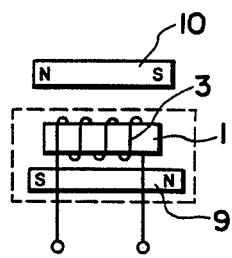

For instance, FIG. 3 shows that the detection coil 3 is wound around the asymmetric excitation type magnetic device 1 and an auxiliary magnet 9 producing the above-mentioned auxiliary magnetic field is disposed adjacent to the magnetic device 1. In this arrangement, when the main magnet 10 is moved toward the magnetic device 1, it becomes possible to induce a steep pulse electromotive force across the detection coil 3.

Next the examples of the practical methods for manufacturing the asymmetric excitation type magnetic devices 1 will be described.

Figure 4:
FIGS. 4–6 are sectional views illustrating an embodiment of an asymmetric excitation type magnetic device.

FIG. 4 is a sectional view of the magnetic device in which two kinds of ferromagnetic molecules having different compositions are sequentially deposited alternately in the form of a plane by a DC sputtering process wherein a high voltage of the order of a few kilovolts (KV) is applied in the argon atmosphere of $3.0 \times 10^{-2}$ Torr.

In this case, the magnetic device 1 is produced in the DC magnetic field so that the magnetic anisotropic directions of each layer may be the same.

Reference numeral 12 represents a first magnetic layer having a composition (40 Fe—50 Co—10V) and a coercive force of 30 (Oe).

Reference numeral 13 designates a second magnetic layer with a composition (46 Fe—44 Co—10V) and a coercive force 80 (Oe). Both of the first and second magnetic films have the same thickness of 0.5 micrometers and are laminated one over another. The measurements of the coercive forces were obtained from the upper and lower major surfaces of the magnetic device 1 by the magnetic-kur-effect process.

Next the magnetic device 1 thus produced was cut into a specimen 5 mm in width and 20 mm in length and a detection coil consisting of 100 turns was wound around the specimen in the easy axis of magnetization thereof, thereby fabricating a pulse generator.

In order to apply the external magnetic field, the asymmetric excitation method has been adopted in which the orientation magnetic field, the auxiliary magnetic field and the main magnetic field were determined by the movement of permanent magnet.

First the orientation magnetic field of 200 (Oe) was applied so that the whole magnetic device is magnetized in the positive direction (for instance, in the right direction). Thereafter, when the auxiliary magnetic field of the order of 40 (Oe) was applied in the negative direction (in the left direction), only the direction of magnetization of the second magnetic layer was reversed and was maintinaed in this state as described hereinbefore. Next when the main magnetic field in the positive direction exceeds 40 (Oe), the quick reversal of the second magnetic layer was effected. As a result, a steep pulse electromotive force of 30 mV with a higher degree of S/N ratio was induced across the detection coil.

Furthermore, as one of the methods for the production of asymmetric excitation type magnetic devices, it is possible to produce a composite magnetic layer consisting of first and second magnetic layers 12 and 13 by repeating, over a short period of time, the conditions for growing the two kinds of magnetic layers, that is, the first magnetic layer and the second magnetic layer in the above-mentioned sputtering process.

Figure 5:
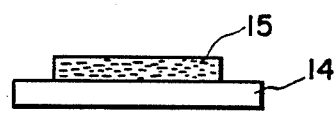

Therefore, as shown in FIG. 5, formed over the major surface of a substrate such as a glass or metal plate 14 was a flat magnetic film which is one micrometer in thickness consisting of the mixed ferromagnetic molecules, whereby the asymmetric excitation type magnetic device 15 was obtained.

The detection coil was wound in a manner substantially similar to that described above and the external magnetic field was applied by the asymmetric excitation method, so that the pulse generation phenomenon substantially similar to that described above could be observed. Such phenomenon can be produced in an asymmetric excitation magnetic device consisting of a vertical magnetic film due to the same underlying principle of the present invention.

Figure 6:

FIG. 6 shows an asymmetric excitation type magnetic device which was produced by growing a first magnetic layer which consists of a ferromagnetic substrate 16 in which anisotropic directions are oriented in the same direction, closely contacting a thin second magnetic layer 17 different in kind or composition from the first magnetic layer 16 over the major surface thereof, and rolling them into a uniform lamination.

Figure 7:
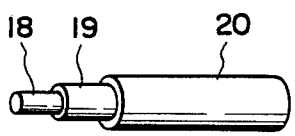
FIG. 7 is a schematic view of another embodiment thereof.

FIG. 7 shows an embodiment in which first and second cylindrical magnetic layers 19 and 20 are deposited over the cylindrical surface of a core line 18 made of a non-magnetic material. In this case, two magnetic layers are deposited over the cylindrical surface of the core wire, but it should be understood that even if more than three magnetic layers can be laminated, the above-described functions and effects can be similarly attained.

In order to grow the ferromagnetic layers by depositing the ferromagnetic molecules, in addition to the above-mentioned sputtering process, the vacuum evaporation process, the electric plating process, the non-electrolytic plating process and so on can be, of course, used. Furthermore, they can be produced by the rolling of leaf-shaped magnetic foils or the cylindrical cladding process.

Therefore, the asymmetric excitation type magnetic devices in accordance with the present invention produced in the manners described above can be made thin in thickness and compact in size in a simple manner so that when the flat detection coil defined by the vacuum evaporation process or the printing process is used, the whole asymmetric excitation type magnetic devices in accordance with the present invention can be made further compact in size.

When permalloy (Fe, Ni) was used as a component of the asymmetric excitation type magnetic device in accordance with the present invention, the effects and features substantially similar to those described above can be attained. In addition, the present invention can use amorphous magnetic materials or the ferromagnetic molecules of the oxidized magnetic materials to that the asymmetric excitation type magnetic devices in various constructions and having various functions can be produced.

Furthermore, when the ferromagnetic molecular layers in accordance with the present invention are subjected to a heat-treatment, magnetic characteristics can be imparted to the magnetic device or the latter can be further stabilized.

The asymmetric excitation type magnetic device in accordance with the present invention is an excellent device capable of generating high-quality pulse electromotive forces due to the unique application of the magnetic field or the asymmetric excitation method without subjecting the component parts under the tension process, the twisting and untwisting process and other mechanical processes.

According to the present invention, the process of bonding in a coaxial direction the anisotropy of different kinds of ferromagnetic molecules in a horizontal or vertical plane is used so that the finished products can be made considerably compact in size.

Therefore when not only a unitary pulse generator is designed and constructed but also a magnetic-sensitive device comprising a plurality of asymmetric excitation magnetic devices are arranged in a plane into a unitary construction as a magnetic-sensitive device and when the magnetic field of a magnet which moves straight, for instance, along the above-mentioned magnetic-sensitive device, it becomes possible to detect a time when a pulse is generated, thereby designating the position of a machine or equipment mounted with a magnet. For instance, the above-mentioned magnetic-sensitive device can be widely used for the automation of various electric, electronic and mechanical machines and equipment each of which has a stationary portion and a moving portion.

Furthermore, when a plurality of asymmetric excitation type magnetic devices mounted on a cylindrical surface is used as a stator and also one or more magnets are used as a rotor, a rotating pulse generator which is extremely compact in size can be obtained.

In addition, when the asymmetric excitation type magnetic device in accordance with the present invention is divided into a plurality of extremely small regions which are interconnected with excitation wires in the form of a matrix and a unique magnetic field is applied to them by the above-mentioned asymmetric excitation method, there can be provided a novel stationary storage device which is basically different from the conventional disk memories which must be spun.

The present invention also relates to an ammeter of an asymmetric excitation type provided by various special treatments.

First, the composite magnets used in the present invention will be briefly described.

For instance, when a wire-shaped ferromagnetic material is, for instance, subjected to external stresses or is twisted, it becomes a composite magnet in which the portion adjacent the axis of the wire has a relative high coercive force while the outer peripheral portion adjacent said first mentioned portion has a small coercive force. Such composite magnets can be provided by laminating a plurality of magnetic layers each having different magnetic characteristics such as metal oxides, amorphous magnets and so on in such a way as to have uniaxial anisotropy. These composite magnets have the following special characteristics.

First, only the direction of magnetization of the portion having a relatively low coercive force can be reversed to the positive or negative direction in response to the direction of application of the external magnetic field by the asymmetric excitation due to the external magnetic field. Furthermore, the reversal speed is considerably high in the direction of magnetization of the adjacent portion having a strong coercive force.

Therefore, in response to the variations of magnetic flux due to such fast reversal speed, it becomes possible to induce a steep pulse signal across a detection coil disposed adjacent to the composite magnet.

It follows therefore that when the external magnetic field is composed of alternative positive and negative magnetic fields produced by an alternating current, a time when a pulse signal is induced can be detected thereby to detect an electric current at this detection time.

However, in the composite magnets of the type described above, it happens that the magnitude of the external magnetic field, that is, the value of an alternating current does not become inevitably stable because it depends upon the previous history of how the portion having a high coercive force has been magnetized. This is an inevitable phenomenon due to a magnetic hysteresis characteristic so that when the composite magnets are used as an electric current sensor, some suitable correction means to correct or compensate such variations must be provided.

On the other hand, according to the present invention, the objects of a current sensor can be attained by a simple means to be described below. More particularly, according to the present invention, a bias magnetic field having a predetermined relatively low value sufficient to magnetize a portion having a low coercive force in the positive direction, is normally applied and when the negative magnetic field produced by an alternating current which intersects with the above-mentioned bias magnetic field is greater than the bias field, a pulse signal is induced across a sensor coil mounted on the composite magnet at the next time when the positive magnetic field is produced.

Next a preferred embodiment of the present invention will be described in detail with reference to the accompanying drawings.

Figure 8:
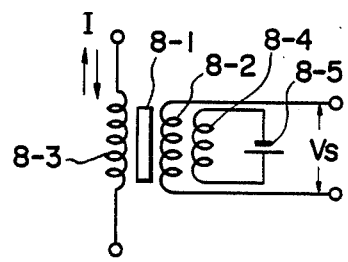
FIGS. 8, 10 and 11 show an embodiment of a current ammeter in accordance with the present invention.

FIG. 8 shows the fundamental construction and reference numeral 8-1 represents the above-mentioned composite magnet; 8-2, a detection or sensor coil mounted on (for instance, wound around or disposed in the vicinity of) the composite magnet 8-1; 8-3, an exciting coil through which an alternating current I flows to produce an external magnetic field; 8-4, a coil for producing a bias magnetic field in order to always magnetize the portion having a low coercive force of the composite magnet 8-1 in the positive direction; and 8-5, a direct current source.

Next, the mode of operation will be described with reference to the time chart shown in FIG. 9. First, a constant bias magnetic field $H_{DC}$ is always applied to the composite material 8-1 in the positive direction as indicated by the broken lines d.

When the exterior magnetic field $H_{AC}$ produced by the alternating sensor current I flowing through the -sensor element 8-1.

However, as shown in FIG. 9(b), when the external magnetic field $H_{AC}$ produced by the sensor current I (in this case, the absolute value of its maximum peak value is greater than $H_{DC}$) is applied, the combined magnetic field ($H_{DC}+H_{AC}$) indicate..d by the solid line is applied.

More particularly, first only the region having a small coercive force is displaced in the negative direction by the negative magnetic field $H_R$. It is subsequently displaced or reversed in the positive direction by the succeeding application of the positive magnetic field Hs. In this case, the small coerciveforce portion is reversed or displaced in the same positive direction of magnetization of the adjacent portion having a strong coercive force so that the displacement or reversal speed is very fast as described above.

Figure 9:
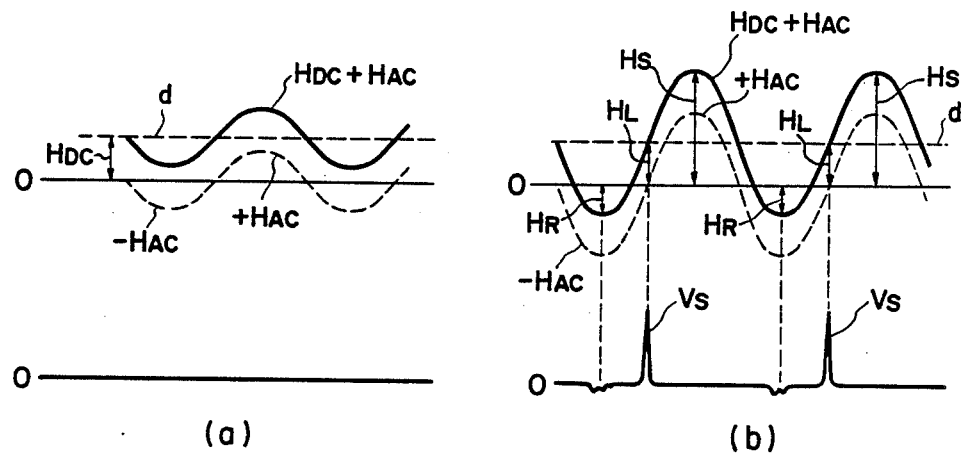
FIGS. 9(a) and 9(b) are a time chart used to explain the mode of operation thereof.

As a result, at the time point at which a limit magnetic field $H_L$ required for causing the displacement or reversal is applied, the steep pulse signal Vs is induced across the sensor coil 8-2 as shown in the lower portion of FIG. 9 so that it is confirmed by the detection of this pulse signal that a previously determined electric current flows.

Figure 10:
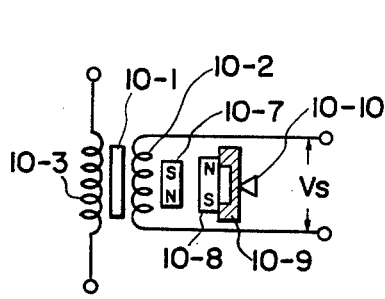

In the above-described embodiment, DC is used to always apply a predetermined bias magnetic field, but as shown in FIG. 10 the same effect can be obtained when a permanent magnet 10-7 is disposed in the vicinity of the composite magnet 10-1.

In practice, when the current sensor in accordance with the present invention is disposed at the end of wiring, it becomes necessary to check whether or not the current sensor can correctly operate. In this case, for instance, as shown in FIG. 10, a permanent magnet 10-8 acting in the positive direction of the magnetic field is disposed and a closed-magnetic-path auxiliary magnet 9 (indicated by the hatched lines) which is caused to normally be in contact with the permanent magnet 10-8 is moved away therefrom by an operating member (or a push button or the like). In this case, the positive magnetic field of the permanent magnet 10-8 is applied so that the pulse signal Vs is induced. Consequently, in response to the detection of pulse signal Vs thus induced, the normal operation of the ammeter can be confirmed. Alternatively, a check auxiliary excitation coil (not shown) can be disposed through which an electric current is caused to flow by a remote control system to produce a magnetic field.

Figure 11:
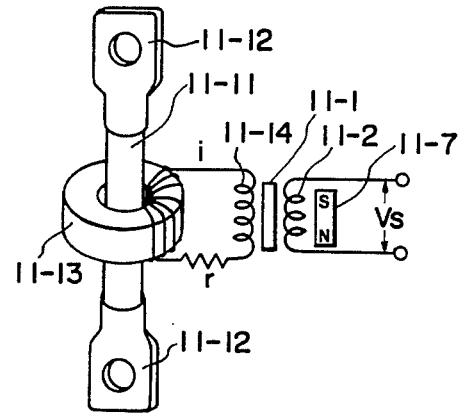

In the case of the application of the current sensor in accordance with the present invention to a wiring system such as a power cable 11-11 as shown in FIG. 11 or other devices through which flows an electric current having a high value, the current sensor is connected through a terminal 11-12 in a power board and a secondary current i is caused to flow through an exciting coil 11-14 wound around the core 11-13 of a current transformer. Thereafter following the above-described procedure, the composite magnet 11-1 is magnetized. Reference character r indicates a resistor for adjusting the value of the exciting current.

In this case, it is so arranged that in response to the limited value of the current flowing through, for instance, the power cable 11-11, the pulse signal Vs is induced across the detection coil 2. Therefore, it is apparent that the operation and effects of a current sensor can be obtained.

Accordingly, in the cases of the above-described embodiments, when a detection current having a predetermined value is set so as to correspond to a limited current flowing through a line, the current sensor in accordance with the present invention can be used as an overcurrent sensor with an extremely high accuracy.

As described above, the current sensor in accordance with the present invention can be made simple in construction and compact in size and can determine a limited current in a suitable manner, and can operate with an extremely high accuracy. In addition, the current sensors in accordance with the present invention can be produced at less cost and have the effect to be applied as sensors for sensing various loads connected to the ends of a plurality of wiring systems.

Therefore, the pulse signals derived from the sensors disposed so as to detect a plurality of loads distributed over a large area are converted into optical signals so that the centralized monitor control can be carried out by constructing an optical cable network and furthermore the present invention may be equally applied to attain various effects.

Next, a circuit for detecting whether or not the current sensor in accordance with the present invention normally operates correctly, will be described hereunder.

Referring first to the accompanying drawings, the underlying principle of the present invention will be described.

Figure 12:
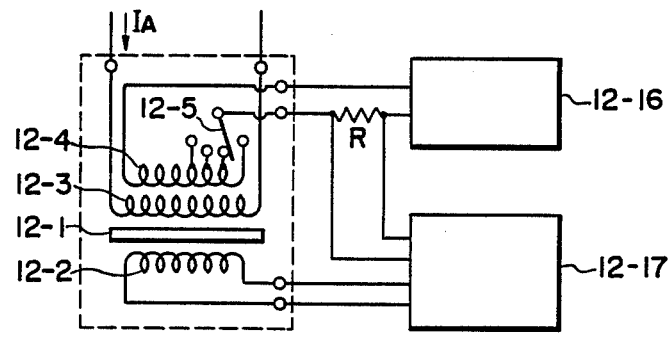
FIG. 12 is a circuit diagram of an ammeter utilizing a composite magnetic body in accordance with the present invention.

FIG. 12 is a circuit diagram of a fundamental circuit in accordance with the present invention. Reference numeral 12-1 designates a composite magnet; 12-2, a detection coil mounted on (for instance, wound around or disposed in the vicinity of) the composite magnet; 12-3, an exciting coil adapted to produce a magnetic field which is dependent upon the magnitude of an alternating detection current $I_A$; 12-4, a detection coil and 12-5, a switching means all of which are assembled into a unitary construction which in turn is disposed within a housing.

The special characteristics of the composite magnet 12-1 used in the present invention will be first described as follows.

When the positive and negative magnetic fields are produced by the AC as the external magnetic fields intersect each other, it now becomes possible to detect the value of the AC in response to a time point when a pulse electromotive force is produced.

However, in addition to the above-described ferromagnetic bodies, it does not necessarily follow that the magnitude of the external magnetic field at a time when the pulse electromotive force is produced, that is, the value of the alternating current, is maintained at a constant magnitude because it depends upon the history of how the portion having the large coercive force is magnetized even in the case of the composite magnet used in the present invention.

However, in the current sensor in accordance with the present invention, the detection magnetic field is superposed at a predetermined timing at each cycle of the alternating detecting current, that is, a limit magnetic field having a magnitude sufficient to magnetize only the portion having a weak coercive force of the composite magnet in the positive direction is applied at each cycle, so that the above-described history is corrected and consequently the stable operation can be ensured.

Figure 13:
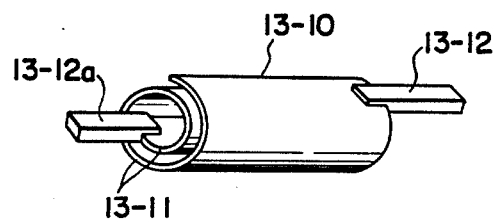
FIG. 13 shows schematically a cylindrical coil.

Furthermore, as shown in FIG. 13, the excitation coil 12-3 of FIG. 12 which produces the magnetic field whose value is dependent upon the magnitude of the alternating detection current $I_A$, is so designed and constructed that the electric current flows from one terminal 13-12 to the other terminal 13-12a of a cylindrical coil 13-11 formed by winding a sheet of conductor 13-10 and, as a result, a uniform magnetic field thus generated is caused to intersect the composite magnet 12-1 at a hollow portion of the cylindrical coil. The fact that the thickness of the front end of the plate of the conductor 13-10 is varied to adjust an electric current density, whereby the magnetic field is uniformly extended between the both ends of the cylinrical coil 13-11, is extremely effective to operate the composite magnet in accordance with the present invention with a high accuracy.

Figure 14:
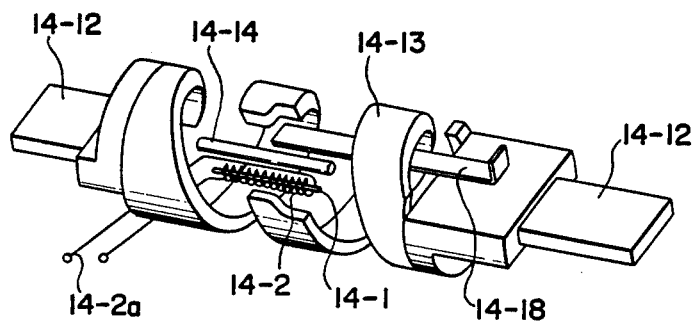
FIG. 14 is a schematic view of an embodiment having a spiral conductor.

Alternatively, as shown in FIG. 14, the arrangement in which an electric current is caused to flow through a spiral coil 14-14 is effective.

Next, the role of the detecting coil 12-4 and an electric sensor in accordance with the present invention will be described.

Figure 15:
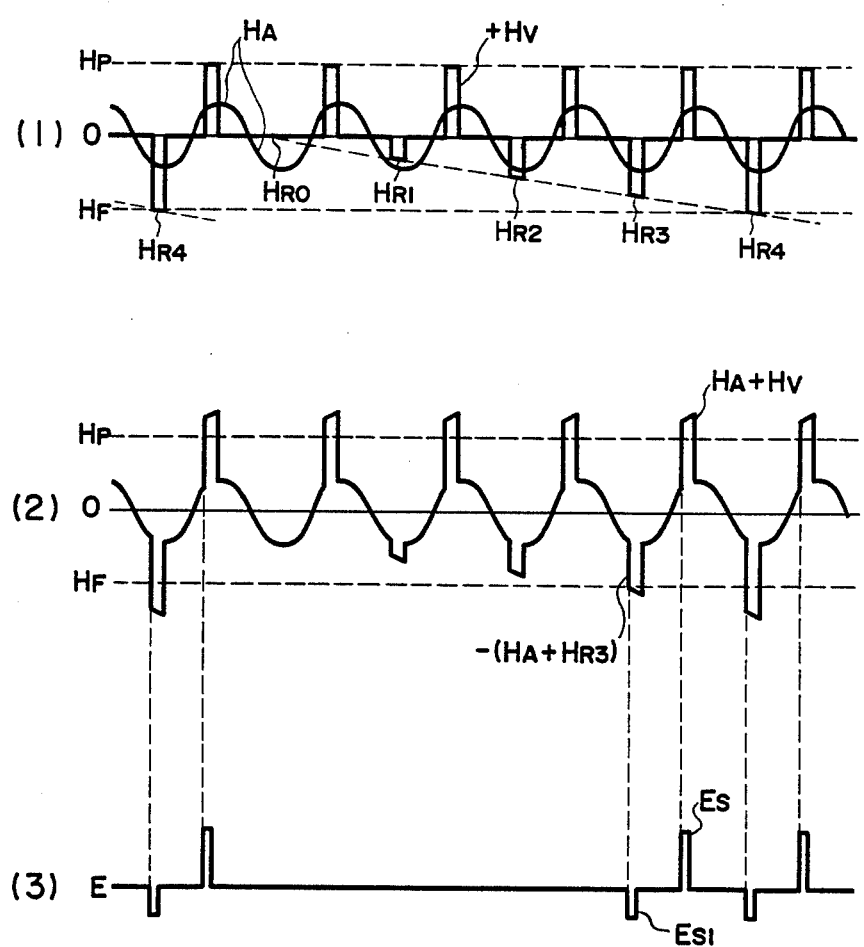
FIGS. 15(1-3) and 16(1, 2, 1A, 2A, 3 and 3A) show time charts, respectively, of an exerting magnetic field and pulse electromotive forces.

FIG. 15 shows an embodiment of a method for measuring the value of an alternating detecting current $I_A$ by utilizing the electric sensor in accordance with the present invention. FIG. 15(1) shows a time chart when an exciting magnetic field $H_A$ produced in the hollow portion of the cylindrical exciting coil, the bias magnetic fields $H_{R1-R4}$ in the negative direction which are gradually increased stepwise at each cycle and the detecting magnetic field $+Hv$ having a limit value Hp in the positive direction sufficient to reverse the direction of the magnetization of the portion of the composite magnet having a relatively low coercive force are intersected by each other. Furthermore, a value $H_F$ is a limit value at which the direction of the magnetization of the portion of the composite magnet 1 having a relatively small coercive force is sufficiently reversed in the negative direction.

FIG. 15(2) shows the waveform of the magnetic fields combined in the manner described above. It is seen that the combined field of $-(H_A-H_{R3})$ acts on the composite magnet 1 as the auxiliary external magnetic field (corresponding to the above-mentioned $H_F$) in the negative direction so that, as shown in FIG. 15(3), a small negative pulse $E_{S1}$ is produced. On the other hand, when the main combined magnetic field $+(H_A+H_v)$ acts in the positive direction, a steep pulse electromotive force Es is induced.

Therefore, since $H_F$ represents a constant inherent to a composite magnet and $H_{R3}$ is a known detecting magnetic field which detects a time point at which a pulse is induced, the value of the detected current $I_A$ can be obtained from the following equations:

$$H_A = H_F - H_{R3}$$

Hence, $$I_A = N \times H_A$$

where N represents a number of turns of the coil through which flows the detected current.

Figure 16:
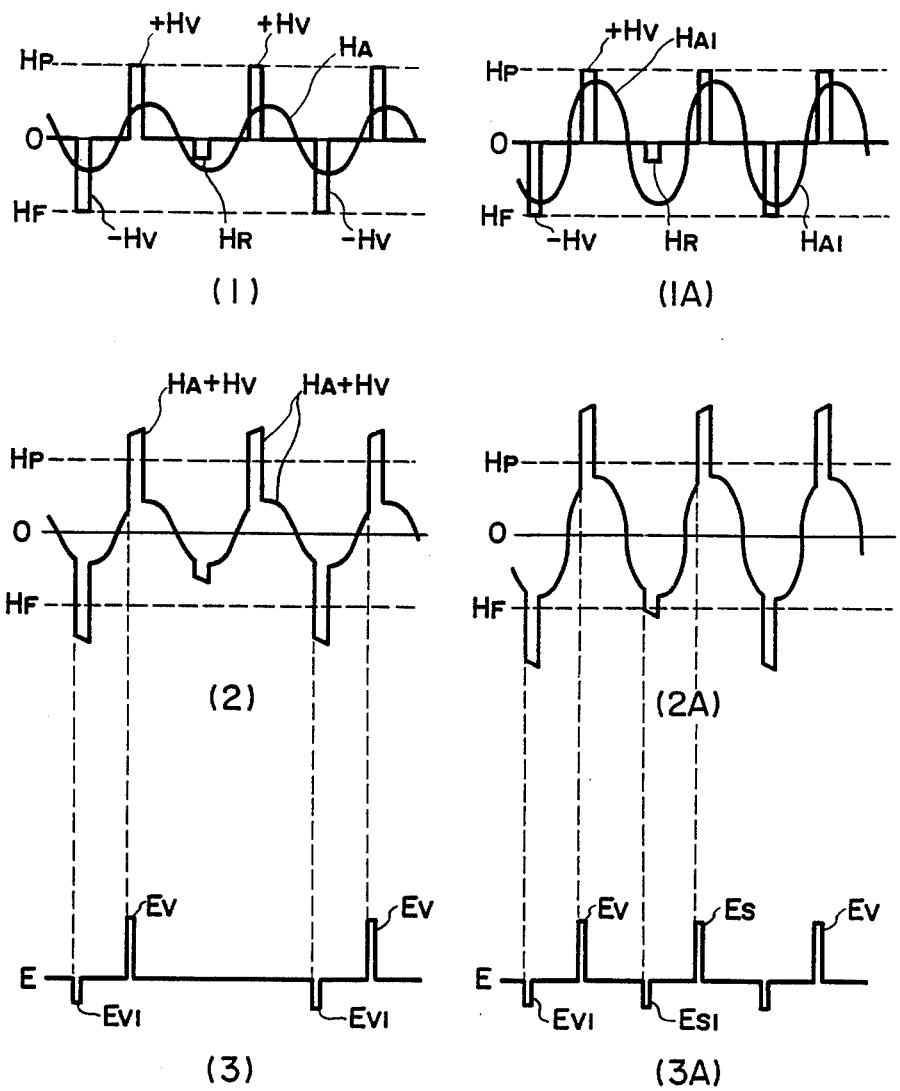

FIG. 16 shows an embodiment in which the above-described current sensor is used as an overcurrent sensor.

In this case, as shown in FIG. 16, the, detecting magnetic fields $+Hv$ and $-Hv$ each respectively correspond to the above-mentioned limit magnetic fields Hp and $H_F$ of the composite magnet at least every other cycle of the detected current. During this interval, the electromagnetic field $H_R$ in the negative direction and the electromagnetic field Hv in the positive direction are applied as a part of the detecting magnetic field in order to generate a predetermined overcurrent.

The left portions of FIG. 16(1)-(3) shows the charts, respectively, of the magnetic fields and the pulse electromotive force E in the case where the value of an alternating current to be detected is within a predetermined range. More particularly, FIG. 16(1) shows the mode of operation of the detecting magnetic fields $+Hv$ and $-Hv$ whose values correspond to those of the above-mentioned limit magnetic fields Hp and $H_F$ of the composite magnet and the exciting magnetic field $H_A$ produced by an alternating current to be detected in addition to the magnetic field $H_R$ in the negative direction.

FIG. 16(2) shows the combined magnetic field so that, as shown in FIG. 16(3), the electromotive force $E_{v1}$ and Ev only are intermittently generated at every other cycle in response to the positive and negative detecting magnetic fields. Whether or not the current sensor in accordance with the present invention is operating correctly can be detected by the detection of the intermittent generation of the pulse electromotive forces.

At the instant when the current to be detected reaches a predetermined overcurrent, the mode of operation becomes as shown on the right sides of FIGS. 16(1A)-(3A).

More particularly, FIG. 16(1A) shows the actions of the detecting magnetic fields $+Hv$ and $-Hv$ and the magnetic field $H_R$ on the exciting current $H_{A1}$ produced by an alternating current to be detected which reaches a predetermined overcurrent.

As shown in FIG. 16(2A), in each cycle, after the magnetization of the magnetic field in the negative direction (which functions as the above-mentioned auxiliary magnetic field) which is greater than the negative limit magnetic field $H_F$, the mode of magnetization of the magnetic field (which functions as the above-mentioned main magnetic field) in excess of the positive limit magnetic field Hp follows.

Therefore, as is shown in FIG. 16(3), the pulse electromotive forces $Ev_1$ and Ev or $Es_1$ and Es are generated at each cycle due to the positive and negative detecting magnetic fields so that the overcurrent condition can be detected by the detection of the conditions of such succeeding pulses.

As described above, in the current sensor in accordance with the present invention, the detection of an electric current is carried out in response to the satisfactory or unsatisfactory conditions of the pulse-electromotive-force generation so that the detected pulse can be completely separated from the pulses generated by the noise-like electromagnetic fields and detected.

For instance, in the case of the overcurrent sensor described above with reference to FIG. 7, when abnormal magnetic fields which are produced by an oscillating transient current are superposed on the magnetic field $H_A$, produced by the current to be detected and also on the detecting magnetic field Hv, some pulses each of which is generated at an incorrect timing are generated. It follows, therefore, that the overcurrent mode is detected at a time point when each pulse electromotive force is generated at a correct timing.

In the above-mentioned embodiment, the system has been explained in which one positive or negative detecting magnetic field is superposed at each half cycle of an electric current to be detected, but, as shown in FIG. 12, a plurality of detecting magnetic fields can be produced at a suitable timing by the signal current generator 12-16 or various combinations of various magnetic fields can be used in accordance with the objects.

An arithmetic-logic unit 12-17 measures the value of a detecting magnetic field in response to the voltage across the resistor R at a time point when a pulse electromotive force is generated across a detecting coil 12-2 thereby to operate the value of an electric current to be measured in a manner substantially similar to that described above.

Furthermore, the number of turns of the detecting coil 12-3 is increased or decreased by actuating the switching means 12-5 thereof so that the value of the detecting magnetic field can be varied as shown in FIG. 12. In this case, a detecting magnetic field is varied in the form of the resultant magnetic field with the magnetic field produced by an electric current to be detected so that it becomes possible to provide an electric current sensor of the type in which a limit value of a detecting electric current can be adjusted or switched.

Referring next to FIG. 14, another method for adjusting or switching a limit value of an electric current to be detected will be described. As shown in FIG. 14, in order to vary the magnitude of the limit value of a detecting electric current, a ferro-magnetic body having a suitable length is used as a ferromagnetic control means 14-18 which in turn is moved toward or away from the composite magnet 14-1.

The current sensor in accordance with the present invention can be made simple in construction and compact in size and can measure any value of an electric current with a high accuracy without using an instrumental transformer such as a current transformer. Furthermore, the present invention has a feature that a pulse electromotive force is generated when the value of the electric current to be detected reaches a previously determined value so that it can be used as an electric sensor not only in a power distribution system but also in general electric circuits. Therefore, the current sensor in accordance with the present invention is very effective when used as a digital ammeter or an overcurrent sensor.

In addition, the current sensors in accordance with the present invention can be produced at less cost and have the feature that they can be used as sensors for the early detections of the failures of a plurality of various kinds of loads especially at the ends of wiring systems.

Therefore, the pulse signals from the sensors capable of detecting a plurality of loads distributed over a wide range can be converted into optical signals so that the centralized monitor control becomes possible by constructing a network of optical fiber cables.

Next, the underlying principle as well as the construction of the present invention will be described when the latter is applied to an electromagnetic type pulse generator.

FIG. 17 shows a magnetic sensor 17-3 in which a plurality of composite magnets 17-1 to 17-n are disposed in parallel with each other and spaced apart from each other by a suitable distance and a first detecting coil 17-2 is wound around the above-mentioned composite magnet array in the direction perpendicular thereto in such a way that the detection coil 17-2 seems to cover the array of composite magnets 17-1 and independent second detecting coils 17-6 and 17-7 are wound around, for example, the specific composite magnets 17-1 and 17-5, respectively.

In this case, various patterns of a plurality of first detecting coils 17-2 may be considered. For instance, independent coils are wound around each of the composite magnets 17-1, . . . , 17-n and the ends of the detecting coils of the adjacent composite magnets are electrically connected in parallel or in series, thereby to define a sole first detecting coil. In addition, a plurality of composite magnets arranged in the manner described above are regarded as warps, while conductors for defining a coil are regarded as wefts so that they are interwoven and their ends are electrically interconnected with each other, thereby also defining a sole first detecting coil.

Referring still to FIG. 17, a first orientation magnet Mo is moved from the position shown in FIG. 17 in the right direction toward the composite magnet 17-1 as indicated by an arrow so that the composite magnet is magnetized in the positive direction. Thereafter an auxiliary magnet Ma is displaced in the right direction so that only a portion having a relatively low coercive force of the composite magnet is reversed in the negative direction.

Next, when a main magnet Mm is displaced in the right direction, each composite magnet successively applied with the magnetic field of the main magnet Mm has its portion having a relative low coercive force the magnetization of which is reversed quickly. As a result, the steep pulse electromotive forces are successively induced across the first detecting coil 17-2.

In this case, the pulse electromotive force is induced across the second detecting coil 17-6 or 17-7 so that the passing position of the main magnet Mm can be detected and the pulse thus obtained is utilized as a signal for controlling a second control means.

The above-described effects and features can be similarly obtained even when the magnetic sensor 17-3 is in the form of a cylinder and the magnets are rotated inside of the cylindrical sensor 17-3. In this case, a pulse generator capable of determining the angle of rotation can be provided.

Referring next to FIG. 18, a plurality of composite magnets are arranged around the cylindrical surface of a cylinder 18-13 and are spaced apart from each other by a suitable distance. Further, a solenoid-shaped first detecting coil 18-14 is wound around the array of the composite magnets 18-1 while independent second detecting coils 18-6 and 18-7 are wound around the specific composite magnets 18-1 and 18-5, whereby a stator 18-15 of the magnetic sensor is formed.

Next, an orientation magnet Mo, an auxiliary magnet Ma and a main magnet Mm which revolve along the inner cylindrical surface of the stator 18-15 are mounted on a rotating shaft 18-16 in such a way that the upper ends of the orientation, auxiliary and main magnets Mo, Ma and Mm become a N pole, a S pole and a N pole, respectively, whereby a rotor 18-17 is provided.

Figure 19:
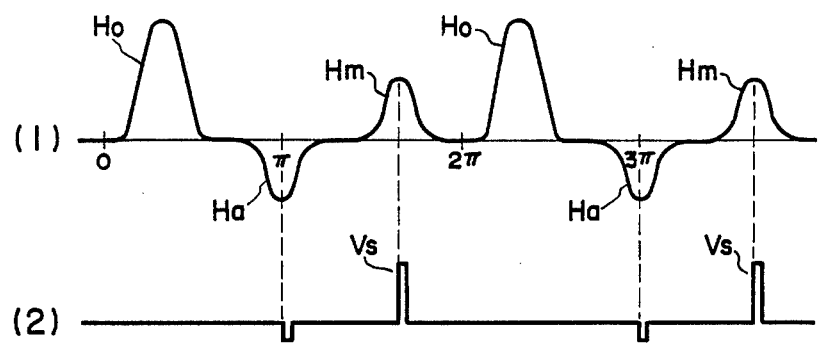
FIGS. 19(1-2), 20(1-3) and 22(1-3) show time charts of the exerted magnetic field and the pulse electromotive force, respectively.
Figure 20:
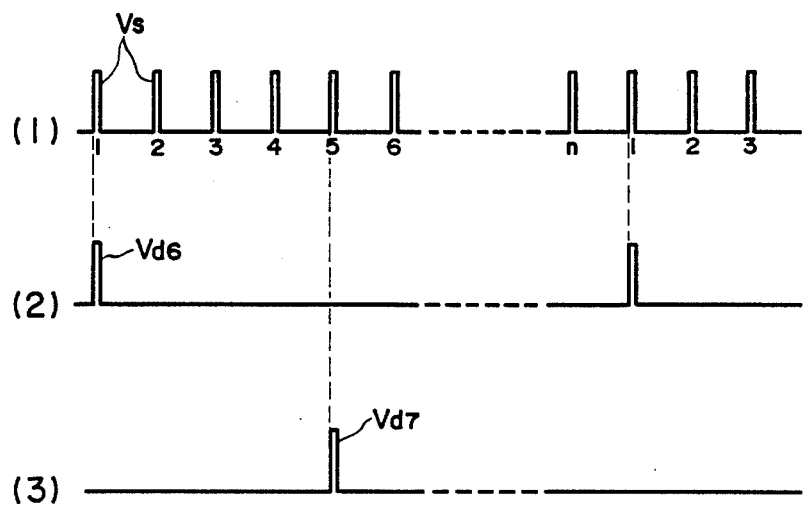

The pulse generation principle of such rotating pulse generator is substantially similar to that described above with reference to FIG. 17, but the modes of operation of the magnetic sensors described above with reference to FIG. 18 are apparent from the time charts shown in FIGS. 19 and 20, respectively.

FIG. 19(1) shows the variations in time of the acting magnet when one composite magnet is observed. Ho represents the orientation magnetic field; Ha, the auxiliary magnetic field; and Mm, the main magnetic field.

When these magnetic fields intersect each other, a pulse is induced across the first detection coil 18-14 as shown in FIG. 19(2).

In terms of the variations in time of the pulses generated across the first detection coil 18-14, as shown in FIG. 20(1), whenever the main magnetic field Hm intersects a number of n composite magnets, the pulse electromotive forces Vs are successively generated. The pulses generated across the second detecting coils 18-6 and 18-7 independently of each other are shown as Vd6 in FIG. 20(2) and as Vd7 in FIG. 20(3).

The position of each detecting coil is previously determined so that it becomes possible to detect by which composite magnet is generated each pulse of a pulse train across the first detecting coil or it becomes possible to detect the angle of rotation of the rotor with a high accuracy at the time when the pulse is generated. Concurrently, the pulse signal generated across the second detecting coil can be used as a signal to be applied to other controlled objects at the time when the pulse is generated.

So far, the mode of operation and effects of the rotor 18-17 having one set consisting of three kinds of magnets have been described, but it is to be understood that when the magnet set is increased in number, the number of generated pulses can be increased accordingly.

According to the present invention, several means can be used as a system for generating pulses by the action of one or more magnets. For instance, a rotating pulse generator as shown in FIG. 21 can also generate pulses in a stable manner.

In the cylindrical magnetic sensor in which a plurality of composite magnets are arranged at the outer cylindrical surface of a cylinder 21-13 in parallel with the axis thereof and are angularly spaced apart from each other by a predetermined angle and a first detecting coil and a second detecting coil are wound around the composite magnets, a cylindrical auxiliary magnet Ma whose top is a S pole is fitted over the cylindrical array of composite magnets disposed in the manner described above, thereby providing a stator. A rotor having at least one main magnet Mm (which may also function as an orientation magnet) whose top is a N pole is disposed within the cylinder 21-13 in such a way that it may revolve along the inner cylindrical surface thereof.

Figure 22:
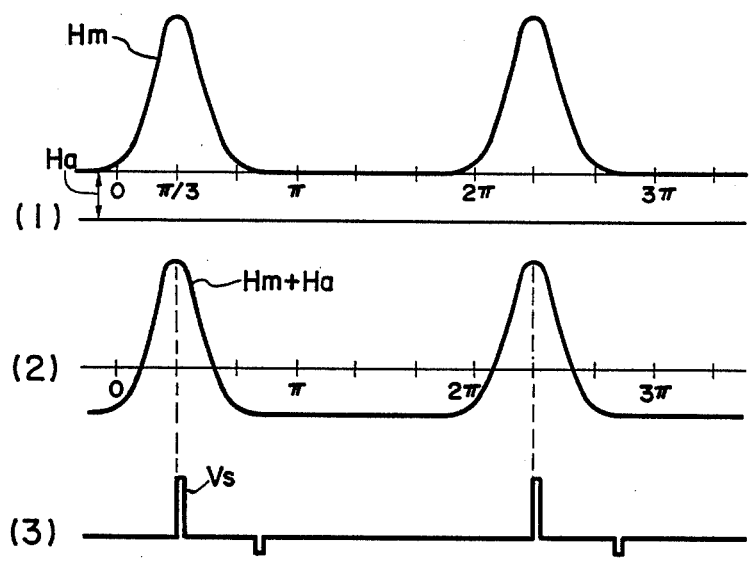

In this case, the mode of operation of the magnetic fields acting on one composite magnet is shown in FIG. 22 and FIG. 22(1) shows the main magnetic field Ha produced by the auxiliary magnet Ma and the main magnetic field Hm produced by the revolving main magnet Mm and the combined magnetic field of such fields is shown in FIG. 22(2). Therefore, as shown in FIG. 22(3), the pulse electromotive forces are generated whenever the main magnetic field Hm intersects the composite magnets. And it is apparent that the second detecting coil generates a predetermined pulse signal in a manner substantially similar to that described above.

In FIG. 21, the cylindrical auxiliary magnet Ma is mounted over the magnetic sensor, but it is understood that it may be mounted in the magnetic sensor and that the present invention is not limited to an auxiliary magnet in the form of a cylinder and can equally utilize an auxiliary magnet Ma in any form as far as its magnetic flux effectively acts.

And as to the shape of each of a plurality of magnets constituting a rotor, normal operation can be ensured even when the magnets used are in the form of a cylinder or a rectangular prism. However, when an extremely high resolution is required in case of finding a position or an angle of rotation, for instance, a bar magnet is shaped in the form of a U so as to cause the magnetic lines to act on a composite magnet in the vertical direction or a magnet whose edge portion is in opposing relationship with respective composite magnets of the magnetic array is also used so that the intensity of the magnetic field is applied in an acute angle. Alternatively, a magnet keeper made of a ferromagnetic material can be disposed along each composite magnet so that the magnetic field may intersect the composite magnet at an acute angle.

For instance, when a magnetic field which moves linearly is applied to the whole array of a plurality of composite magnets disposed in a plane, a train of successive pulse outputs can be generated across the first detecting coil.

Furthermore, when predetermined specific composite magnets are wound with the second detecting coils independently of each other, the inventor has succeeded in controlling other controlled objects in response to a pulse signal at a specific position simultaneous with the generation of the successive pulse signals whose positions can be designated. The above-described embodiment can be widely used in practice in order to attain automation of various electric and electronic devices and equipment and mechanical machines all of which have a stationary portion and a moving portion.

Usefulness of the rotating pulse generator in accordance with the present invention in which the stator is in the form of the cylindrical magnetic sensor while one or more magnets constitute the rotor is considerably increased because, as described above in detail, while the first detecting coil generates successive pulses each designating an angle of rotation of the rotor, a pulse which is used as a coacting control signal is generated with an extremely high accuracy and also an extremely high resolution can be obtained.

Especially, in the case of gasoline engines, in order to obtain an optimum ignition timing, not only a pulse signal for controlling the angle of rotation of a distributor, but also a signal for detecting a cylinder in which the combustion mixture is ignited are needed. Therefore, at present, two pulse generators are disposed and spaced apart from each other by a suitable distance in order to prevent electromagnetic induction interference and the like, but according to the present invention, only one pulse generator is required and it is expected that the rotating pulse generator in accordance with the present invention can be made more compact in size, light in weight and more reliable in operation.

Furthermore, in accordance with the present invention, the pulse information representative of the conditions of the rotating parts which rotate at from a high speed to an extremely slow speed can be obtained, and also the pulse information even in the case of an extremely slow speed hitherto unattainable by the conventional pulse generators can be surely obtained.

Furthermore, in the case of the system in which the auxiliary magnet is securely disposed to normally act, in order to cancel the auxiliary magnetic field so as to permit the action of the strong main magnetic field, it is required to use a stronger main magnet. However, in practice, when the magnitude of the main magnetic field is increased to some extent, the effect that the operation is almost not adversely affected by disturbance of the exterior magnetic fields is attained so that the present invention has a further advantage that the stable operation can be ensured.

Furthermore, the pulse signals generated in accordance with the present invention can be applied to cooperate with a microcomputer or the like mounted on a vehicle so that the exchange of various operation information between the vehicle and the exterior can be effected.

Moreover, the present invention has an extremely considerable effect because the pulse generator in accordance with the present invention can be made compact in size, light in weight, highly reliable in operation, can exhibit a high degree of performance and can be produced at less cost all of which are very severe problems in the conventional pulse generators.

Figure 23:
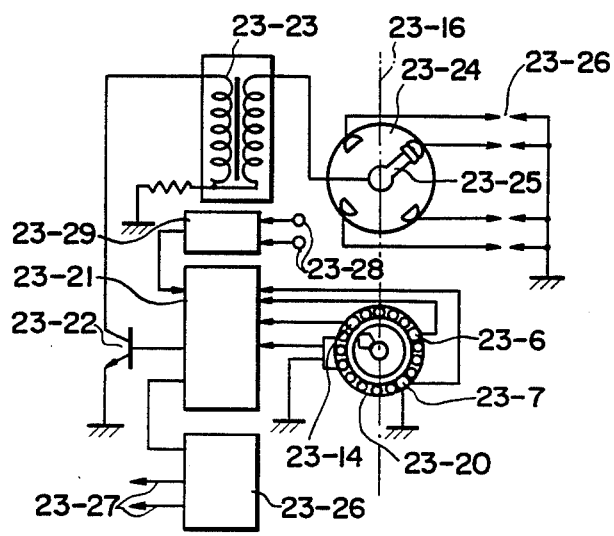
FIG. 23 is a schematic view used to explain an embodiment of an ignition timing control device in accordance with the present invention.

FIG. 23 is an embodiment of an ignition timing control device in accordance with the present invention which is incorporated in a contact-less type ignition system including the rotating pulse generator 23-20 of the type described above.

A first detecting coil 23-14 of the rotating pulse generator 23-20 generates pulses for detecting an angle of rotation thereby to detect an angle of rotation of the rotor at a high resolution and a high accuracy.

The pulse is transmitted through an electronic circuit 23-21 incorporating an ignitor to the gate of a semiconductor control element 23-22 as a trigger pulse so that the control element 23-22 is turned on. A high-voltage thus generated across an ignition coil 23-23 is distributed through a rotor 23-25 to a predetermined cylinder in which an ignition is effected by a spark plug 23-26.

The rotating pulse generator 23-20 and the distributor 20-24 are directly interconnected with each other through the rotating shaft 23-16 and are operatively connected to the crankshaft of an engine. Accordingly, the pulse generated across the second detecting coil 23-6 or 23-7 for discriminating a cylinder can be simultaneously detected, so that it becomes possible to discriminate with an extremely high accuracy a cylinder in which a piston has reached the top dead point in the compression stroke.

Furthermore, the pulse output generated by the rotating pulse generator 23-20 is used, for instance, as a synchronizing signal in an electronic control system. Recently, the computers and other control devices 23-26 are mounted on a vehicle so that many control signals 23-27 which indicate many timings in synchronism with the rotation of the engine with a high accuracy are required. However, according to the device of the present invention, these signals can be derived from the pulse generator of the type described above in a simple manner.

Furthermore, a programmed control device 23-29 processes various information signals 23-28 which are derived from various sensors, respectively, and represent various information such as the temperature of water, the temperature of oil, the degree of humidity, the rotational speed, oscillations or vibrations and the like and these signals are processed by the programmed control device 23-29 so that the information thus processed is applied to the electronic circuit 23-21 incorporating an ignitor or to a microcomputer or is used in the feedback control system, whereby the optimum controls can be obtained.

The effects and features of the above-described embodiments may be summarized as follows:

(1) Simple and Compact Construction:

In the cases of the conventional type ignition timing control device, two pulse generators are required for detecting an angle of rotation and for discriminating a cylinder and must be spaced apart from each other by a relatively long distance in order to prevent electromagnetic interference between them so that the conventional pulse generators cannot be reduced in size. In accordance with the present invention, the same objects described above can be attained by a single pulse generator which is compact in size, light in weight and highly reliable in operation when mounted on a vehicle.

(2) Improvement of Detection Accuracy:

As described in detail above, not only an angle of rotation can be detected with a high accuracy and a high resolution by the pulses for detecting an angle of rotation generated across a first detecting coil and furthermore a pulse for discriminating a cylinder can be generated simultaneously with the generation of the former pulses so that it becomes possible to detect in which cylinder a piston has reached its top dead center point in the compression stroke at an extremely high speed and with a high accuracy.

Furthermore, as described above with reference to the conventional devices, the angle of rotation of the crankshaft of the engine has been detected with a detection accuracy of 15° or 10° which is considered unsatisfactory from the standpoint of the prevention of air pollution and of performance so that there has been a strong demand for a novel technique capable of detecting the angle of rotation of the crankshaft at an extremely high accuracy of less than 1°.

In the revolving pulse generator in accordance with the present invention, a composite magnet which plays a very important role in the stator of cylindrical magnet sensor can be made in the form of a wire so that it is expected to attain a high effect that when a plurality of rotating pulse generators are disposed, a pulse generator which can generate pulses with a high resolution can be obtained.

In addition, in the case of a machine such as a recent Stering engine operated in response to the variations in gas pressure due to alternate heating and cooling, the present invention can be effectively used for controlling an operating position.

(3) Increase Response Speed:

According to the present invention, the conditions of the rotating parts at from a high speed to an extremely low speed as in the case of automotive vehicles can be positively represented by pulse information. Therefore the effect capable of detecting the conditions at an extremely low speed in the form of information pulses hitherto unattainable by the prior art is considerably useful.

(4) Resistance to Disturbance due to External Magnetic Fields:

In the case of the system in which an auxiliary magnet is securely disposed to normally act, a main magnetic field whose magnitude is enough to cancel the auxiliary magnetic field is required on generation of a pulse train. As a result, a strong main magnet must be used. However, in practice, it is effective that the operation can exhibit a relatively high resistance to the exterior magnetic field disturbances and be maintained in a stable state even when a higher main magnetic field is applied.

(5) Others:

In general, the earlier the ignition timing in the engine is, the higher the output becomes, but there is a problem that knocking occurs some time and resultantly the engine performance decreases. Therefore, an optimum ignition timing control is very important. In such a case described above, the pulse signals generated by the rotating pulse generator having the magnetic sensor in accordance with the present invention are very effectively utilized.

In addition, as described before, the present invention has a further effect that information signals derived from various sensors mounted on a vehicle are processed and applied to the electronic circuit or microcomputer incorporating an ignitor or these signals are used in a feedback control system thereby ensuring an optimum operation control. Moreover, devices according to the present invention are operatively connected to other electronic circuits so that it has a yet further effect that the exchanges of various operation information within a vehicle and the exterior thereof and control can be carried out, which was hitherto unattainable.

Furthermore, the present invention can attain the severe requirements that the devices must be compact in size and light in weight and can be produced at less cost.

What is claimed is:

1. An asymmetric excitation type magnetic device having a composite magnetic body and a detecting coil, said composite magnetic body being composed of a plurality of ferromagnetic molecules which are different in composition and coercivity with respect to each other and which are combined so as to have magnetic anisotropy oriented in the same direction, wherein external positive and negative asymmetric magnetic fields are applied to said composite magnetic body in the order: that first an auxiliary magnetic field is applied thereto so as to orient the direction of magnetization to a negative direction of only those ferromagnetic molecules in said composite magnetic body having a relatively small coercivity, and then next a main magnetic field is applied thereto to reverse the direction of magnetization of said ferromagnetic molecules having a relatively small coercivity to a positive direction being the same as the direction of magnetization of ferromagnetic molecules in said composite magnetic body having a relatively strong coercivity, thereby to produce variations in magnetic flux in said composite magnetic body due to rapid flux reversal therein for thereby resultantly generating pulse outputs across said detecting coil in response to said variations in magnetic flux.

2. An asymmetric excitation type magnetic device as set forth in claim 1, further comprising an exciting coil for causing a positive or negative asymmetric external magnetic field to act upon the composite magnetic body by electric excitation, and a detecting coil for inducing a detecting pulse.

3. An asymmetric excitation type magnetic device as set forth in claim 1, wherein the detecting coil is wound around said composite magnetic body and said positive and negative external magnetic fields are produced by permanent magnets.

4. An asymmetric excitation type magnetic device as set forth in claim 2 for use as a static storage device and in which said composite magnetic body is formed into at least one composite magnetic layer having uniaxial anistropy and in which the ferromagnetic molecules thereof having a relatively low coercivity are magnetized in a negative direction under the action of an auxiliary magnet, and in which the magnetization of said low coercivity molecules is extremely quickly reversed to a positive direction the same as the magnetization direction of the ferromagnetic molecules thereof having a high coercivity under the action of a main magnet and which has a plurality of local positions distributed in said composite magnetic layer as storage points so that only when a plurality of first and second auxiliary magnetic fields are applied from the exterior to said composite magnetic layer, a write action which reverses the magnetization of said composite magnetic layer to the negative direction by the combined magnetic field of said plurality of first and second auxiliary magnetic fields is accomplished, and wherein a read-out action by which a pulse is induced in said detecting coil is accomplished at a time point when the next magnetic field is applied to a predetermined storage point.

5. An asymmetric excitation type magnetic device as set forth in claim 4, wherein said ferromagnetic molecules are arranged in such a way that the uniaxial anisotropy thereof is in parallel with a major surface of said composite magnetic body and a plurality of conductors for producing said first auxiliary magnetic fields are disposed in parallel with each other for each storage point of a plurality of storage points arranged in the form of a matrix so that only when the combined magnetic field of said first and second auxiliary magnetic fields acts to cause a magnetization reversal at a storage point in the negative direction, a write action is effected; and wherein a conductor for producing said main magnetic field is disposed at each storage position.

6. An asymmetric excitation type magnetic device as set forth in claim 4 wherein the uniaxial anisotropy of each of said ferromagnetic molecules is made perpendicular to a major surface of said composite magnetic layer and wherein exciting conductors for exciting said first and second auxiliary magnetic fields and said main magnetic field are arranged in a direction perpendicular to said major surface of said composite magnetic layer and from at least one side thereof, whereby a write action or a read-out action may be accomplished.

7. An asymmetric excitation type magnetic device as set forth in claim 2 for use as a moving type storage device wherein said composite magnetic body comprises a composite magnetic layer including a plurality of ferromagnetic molecules each having uniaxial anisotropy and having a plurality of local points acting as information storage points therein, further comprising a magnetic head provided with exciting coils for producing an auxiliary magnetic field and a main magnetic field, whereby when said composite magnetic layer is moved relative said magnetic head, a read-out action from each storage point at which information is stored is accomplished depending upon whether the magnetization of a portion of said composite magnetic layer having a low coercivity was previously reversed to a negative direction or not.

8. An asymmetric excitation type magnetic device as set forth in claim 3, wherein a plurality of said composite magnetic bodies each of which is so processed that only a portion thereof having a relatively low coercivity is magnetized in a negative direction under the force of an auxiliary magnet and is extremely quickly reversed in its magnetization to a positive direction which is the same as the direction of magnetization of a portion thereof having a high coercivity under the action of a main magnet, are arranged in an array so as to be parallel with each other, and wherein a first detecting coil is wound around the array of said composite magnetic bodies thus arrange, and wherein, of all said composite magnetic bodies, at least one selected composite magnetic body is wound with a second detecting coil independently, said device further comprising a pulse generator comprising an auxiliary magnet, a main magnet and an orientation magnet the magnetic fields of which auxiliary, main and orientation magnets are made to intersect said composite magnetic body array, whereby pulse signals are generated across said first and second detecting coils.

9. An asymmetric excitation type magnetic device as set forth in claim 8, wherein said auxiliary magnet is disposed in the vicinity of said composite magnetic body array such that the magnetic field produced by said auxiliary magnet normally acts upon said composite magnetic body array, and wherein said main magnet and said orientation magnet are so disposed as to move toward or away from said composite magnetic body array.

10. An asymmetric excitation type magnetic device as set forth in claim 8, wherein a stator is provided composed of said plurality of said composite magnetic bodies which are arranged around an outer cylindrical surface of a cylinder in parallel with the axis thereof and spaced apart form each other by a predetermined distance, a first detecting coil is wound around said composite magnetic body array and a second detecting coil is wound around at least one selected composite magnetic body of said composite magnetic body array, independently, and wherein the magnetic fields produced by said auxiliary magnet and a main magnet mounted on a rotor are applied to said stator, whereby pulse signals are derived by said first and second detecting coils.

11. An asymmetric excitation type magnetic device as set forth in claim 10, wherein the magnetic field produced by said auxiliary magnet arranged in the vicinity of said composite magnetic body array always acts on said composite magnetic body array and a rotor mainly composed of said main magnet.

12. An asymmetric excitation type magnetic device as set forth in claim 8 wherein a portion of said composite magnetic body having a relatively low coercivity is magnetized in a negative direction under the action of said auxiliary magnet and is extremely quickly reversed in its magnetization to a positive direction which is the same as the direction of magnetization of a portion of said composite magnetic body having a high coercivity under the action of said main magnet; and wherein a plurality of such composite magnetic bodies so formed are disposed in an array in the form of a cylindrical surface of a cylinder, a first detecting coil is wound around said array of said composite magnetic bodies thus arranged and, of said composite body array, at least one selected composite magnetic body is wound with a second detecting coil, whereby a cylindrical magnet sensor is provided as a stator and whereby a rotating pulse generator is provided;

wherein the magnetic fields produced by said auxiliary magnet and said main magnet mounted on said rotor are applied to said cylindrical composite magnetic body array, and wherein pulse signals generated across said first and second detecting coils are made to cooperate with a control signal derived form an electronic circuit incorporating an igniter, thereby providing an ignition timing control device for an engine.

13. A method for the production of an asymmetric excitation type magnetic device having a composite magnetic body composed of a plurality of magnetic molecules which are different in composition and coercivity with respect to each other and which are combined so as to have magnetic anisotropy oriented in the same direction to generate a steep voltage pulse in response to magnetization in the same direction, wherein a plurality of ferromagnetic layers whose compositions are different from each other are laminated over the surface of a substrate, thereby producing a flat composite magnetic layer.

14. A method for the production of an asymmetric excitation type magnetic device having a composite magnetic body composed of a plurality of magnetic molecules which are different in composition and coercivity with respect to each other and which are combined so as to have magnetic anisotropy oriented in the same direction, wherein a plurality of ferromagnetic molecules whose compositions are different from each other are mixed and deposited over a surface of a substrate, thereby forming a flat composite magnetic layer.

15. A method for the production of an asymmetric excitation type magnetic device having a composite magnetic body composed of a plurality of magnetic molecules which are different in composition and coercivity with respect to each other and which are combined so as to have magnetic anisotropy oriented in the same direction, wherein a plurality of ferromagnetic molecules are deposited over the surface of a substrate in such a way that each molecule has a magnetic anisotropy perpendicular to said surface of said substrate thereby to form a composite magnetic layer.

16. A method for the production of an asymmetric excitation magnetic device having a composite magnetic body composed of a plurality of magnetic molecules which are different in composition and coercivity with respect to each other and which are combined so as to have magnetic anisotropy oriented in the same direction, wherein a plurality of cylindrical ferromagnetic layers having a relatively high coercivity and a plurality of cylindrical ferromagnetic layers having a relatively low coercivity are formed, by cladding, in the form of a cylinder around the surface of a core wire thereby to form a composite magnetic layer.

17. A method for the production of an asymmetric excitation type magnetic device having a composite magnetic body composed of a plurality of magnetic molecules which are different in composition and coercivity with respect to each other and which are combined so as to have magnetic anisotropy oriented in the same direction, wherein, for said composite magnetic body, a composite magnetic wire having uniaxial anisotropy in an axial direction thereof is formed by subjecting a relatively fine ferromagnetic wire to at least one production process such as a twisting process thereby to form a composite magnetic body.

18. In combination with an asymmetric excitation type magnetic device having a composite magnetic body composed of a plurality of magnetic molecules which are different in composition and coercivity with respect to each other and which are combined so as to have magnetic anisotropy oriented in the same direction, a current sensor wherein a predetermined constant bias magnetic field is normally applied to a magnetic sensor element consisting of said composite magnetic body and having uniaxial magnetic anisotropy and wherein only a portion of said magnetic sensor element having a low coercive force is magnetized in a positive direction and when a negative magnetic force produced by an alternating current to be detected and which intersects said bias magnetic field is in excess of said bias magnetic field, a pulse signal is generated across a detecting coil mounted on said magnetic sensor element at a time point when the next positive magnetic field produced by said alternating current is applied to and intersects said composite magnetic body.

19. An asymmetric excitation type magnetic device having a composite magnetic body composed of a plurality of magnetic molecules which are different in composition and coercivity with respect to each other and which are combined so as to have magnetic anisotropy oriented in the same direction, wherein a detecting coil for producing a detecting magnetic field in a negative or positive direction and a sensor coil for sensing a pulse electromotive force are mounted on said composite magnetic body which is so formed that only a portion thereof having a relatively low degree of coercivity is magnetized in a positive or negative direction in response to the direction of the application to said composite magnetic body of an auxiliary exterior magnetic field such that when an exterior main magnetic field is applied to said composite magnetic body and acts in the direction of magnetization of a portion of said composite magnetic body having a high coercivity, the magnetization of said composite magnetic body is reversed at an extremely high speed and said auxiliary and main magnetic fields are made to intersect with a magnetic field produced by an electric current to be detected, whereby current sensing is obtained.

20. An asymmetric excitation type magnetic device as set forth in claim 19, wherein said electric current to be detected is made to flow through a cylindrical coil formed by winding a sheet-shaped conductor, and wherein said composite magnetic body is arranged in the magnetic field produced at a hollow interior portion of said cylindrical coil.

21. An asymmetric excitation type magnetic device as set forth in claim 19, wherein said electric current to be detected is made to flow through a spiral conductor and said composite magnetic body is arranged in the magnetic field produced in a hollow interior portion of said spiral conductor.

22. An asymmetric excitation type magnetic device as set forth in claim 19, wherein when the magnetization direction of a portion of said composite magnetic body is caused to be very quickly reversed to produce a pulse electromotive force in said sensor coil under the application of a combined magnetic filed resulting from a plurality of detecting magnetic fields which are gradually increased and a magnetic field produced by said electric current to be detected, the magnitude of said electric current to be detected is determined in accordance with a value of said detecting magnetic field.

23. An asymmetric excitation type magnetic device as set forth in claim 19, wherein the magnitude of said detection magnetic field is so determined that when said electric current to be detected reaches a predetermined value of an overcurrent, a pulse electromotive force is generated in the sensor coil.

24. An asymmetric excitation type magnetic device as set forth in claim 19, wherein pulse electromotive forces due to noise electric currents discriminated by applying said detecting magnetic field produced by an alternating electric current to be detected.

25. An asymmetric excitation type magnetic device as set forth in claim 19, wherein a switching means for increasing and decreasing the number of turns of said detecting coil is provided for determining the magnitude of said detection magnetic field.

26. An asymmetric excitation type magnetic device as set forth in claim 19, wherein at least one ferromagnetic control member is disposed in the vicinity of said composite magnetic body and is caused to move toward or away from said composite magnetic body for varying the magnitude of the magnetic field produced by said electric current to be detected.

* * * * *

UNITED STATES PATENT AND TRADEMARK OFFICE
CERTIFICATE OF CORRECTION

PATENT NO. : 4,944,270
DATED : July 31, 1990
INVENTOR(S) : AKIRA MATSUSHITA, et al.

It is certified that error appears in the above-identified patent and that said Letters Patent is hereby corrected as shown below:

Title page Item [21], cancel "158,787", insert --175,787--.

Signed and Sealed this

Twenty-eighth Day of January, 1992

Attest:

HARRY F. MANBECK, JR.

*Attesting Officer*      *Commissioner of Patents and Trademarks*